(12) United States Patent
Zanetta et al.

(10) Patent No.: US 9,110,484 B2
(45) Date of Patent: Aug. 18, 2015

(54) TEMPERATURE DEPENDENT BIASING FOR LEAKAGE POWER REDUCTION

(71) Applicant: Freescale Semiconductor, Inc., Austin, TX (US)

(72) Inventors: Pedro Barbosa Zanetta, Campinas (BR); Ivan Carlos Ribeiro Nascimento, Campinas (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 4 days.

(21) Appl. No.: 14/035,704

(22) Filed: Sep. 24, 2013

(65) Prior Publication Data

US 2015/0084684 A1 Mar. 26, 2015

(51) Int. Cl.
*H03K 3/01* (2006.01)
*G05F 3/24* (2006.01)
*H03K 17/14* (2006.01)

(52) U.S. Cl.
CPC .............. *G05F 3/245* (2013.01); *H03K 17/145* (2013.01); *H03K 2217/0036* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 5,614,847 A | 3/1997 | Kawahara et al. | |
| 6,031,778 A | 2/2000 | Makino et al. | |
| 6,046,627 A * | 4/2000 | Itoh et al. | 327/534 |
| 6,097,113 A * | 8/2000 | Teraoka et al. | 327/537 |
| 6,163,195 A * | 12/2000 | Jefferson | 327/262 |
| 6,329,874 B1 | 12/2001 | Ye et al. | |
| 7,276,956 B2 | 10/2007 | Furuta et al. | |
| 7,420,358 B2 * | 9/2008 | Byeon et al. | 323/314 |
| 7,772,917 B2 * | 8/2010 | Itoh et al. | 327/534 |
| 7,911,261 B1 | 3/2011 | Shamarao | |
| 2005/0116765 A1 | 6/2005 | Sakiyama et al. | |

* cited by examiner

*Primary Examiner* — Long Nguyen
(74) *Attorney, Agent, or Firm* — Luiz Von Paumgartten; Fogarty, L.L.C.

(57) ABSTRACT

Temperature dependent biasing for leakage power reduction. In some embodiments, a semiconductor device may include a biasing circuit configured to generate a voltage that varies dependent upon a temperature of the semiconductor device and a logic circuit operably coupled to the biasing circuit, where the voltage is applied to a bulk terminal of one or more transistors within the logic circuit, and where the voltage has a value outside of a voltage supply range of the logic circuit. In another embodiment, a semiconductor device may include a biasing circuit configured to generate a voltage that varies according to a temperature of the semiconductor device and a power switch operably coupled to the biasing circuit, where the voltage is applied to a gate terminal of the power switch, and where the voltage has a value outside of a voltage supply range of the power switch.

13 Claims, 6 Drawing Sheets

TEMPERATURE DEPENDENT BIASING FOR LEAKAGE POWER REDUCTION

FIELD

This disclosure relates generally to semiconductors, and more specifically, to temperature dependent biasing for leakage power reduction.

BACKGROUND

Some semiconductor devices have multiple power domains that allow the device to perform with varying power consumption. For example, when operating in low-power mode, a device's power consumption may be reduced by disconnecting one or more circuits from a power supply using one or more power switches. In general, these power switches are large, and therefore their subthreshold or leakage currents—that flow when the power switches are turned off—are significant.

As the inventors hereof have recognized, leakage has become a major contributor to the overall power consumption of modern semiconductor devices, particularly for devices designed to operate with low-power. As such, a need has been identified for a low-power circuit that is able to control the threshold voltages of certain transistors and/or to drive the gate of a power switch beyond its normal supply voltage range in order to reduce the power consumption due to subthreshold currents.

BRIEF DESCRIPTION OF THE DRAWINGS

Embodiments of the present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Disclosed herein are systems and methods for temperature dependent biasing for leakage power reduction. In some embodiments, a biasing circuit may be configured to generate voltage(s) beyond (e.g., above or below) the normal voltage supply range of logic circuits and of power switches. The generated voltage(s) vary as a function of temperature in such a manner as to reduce leakage currents that tend to increase with temperature. The current consumption of the biasing circuit is also designed to increase with temperature. Therefore, the power consumption of the biasing circuit itself is negligible when the leakage in the logic circuits and of power switches is negligible (e.g., when the temperature is low).

Figure 1:
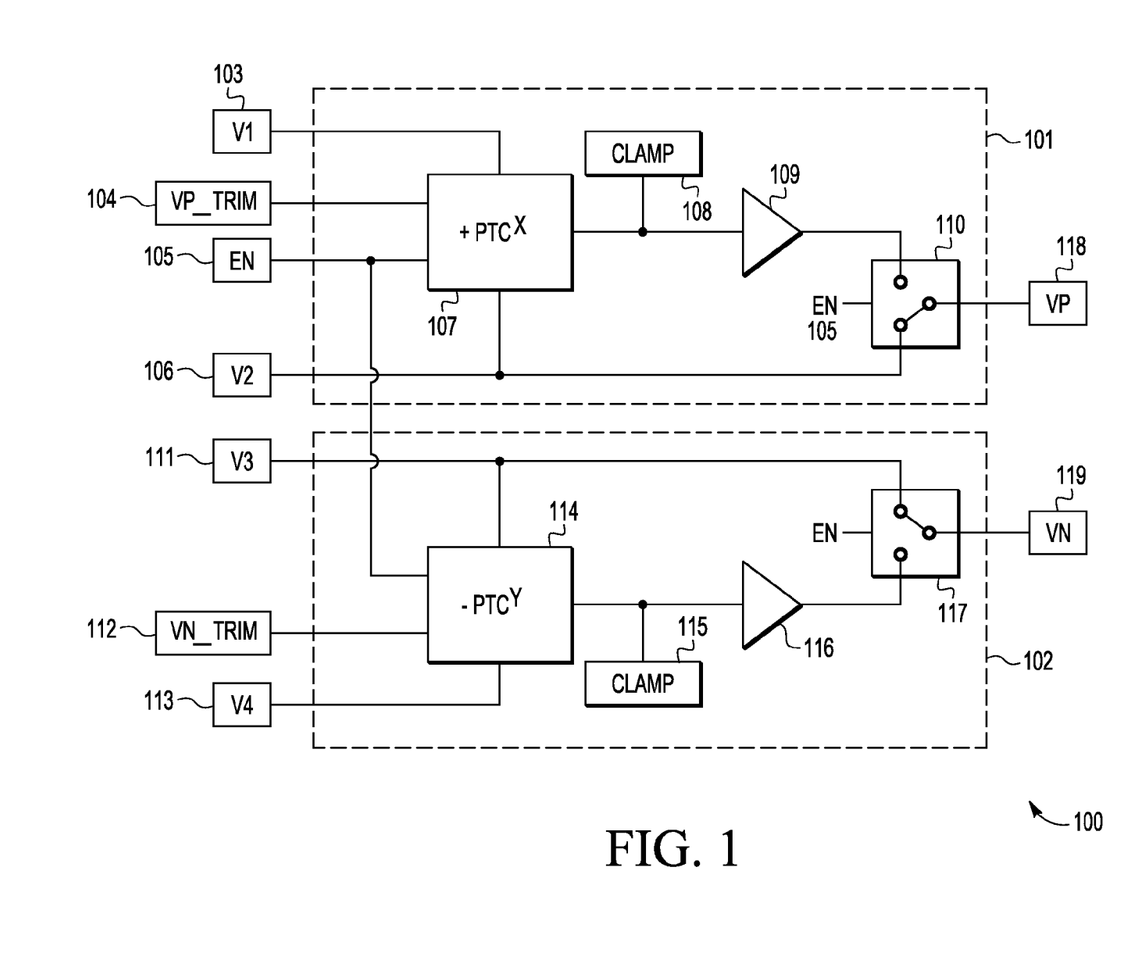
FIG. 1 is a circuit diagram of an example of a biasing circuit according to some embodiments.

FIG. 1 is a circuit diagram of an example of biasing circuit 100 according to some embodiments. As illustrated, biasing circuit 100 includes first portion 101 and second portion 102. First portion 101 of biasing circuit 100 receives as inputs first voltage (V1) 103, first control signal (VP_TRIM) 104, enable signal (EN) 105, and second voltage (V2) 106; and outputs first temperature-dependent voltage (VP) 118. Second portion 102 of biasing circuit 100 receives as inputs third voltage (V3) 111, second control signal (VN_TRIM) 112, enable signal (EN) 105, and fourth voltage (V4) 113; and it outputs second temperature-dependent voltage (VN) 119.

Within first portion 101, first temperature-dependent, voltage generating circuit (+PTC$^X$) 107 receives V1 103, VP_TRIM 104, EN 105, and V2 106. First temperature-dependent, voltage generating circuit 107 is coupled to first voltage clamp circuit 108 and to an input of buffer 109. An output of buffer 109 is coupled to first analog multiplexer 110, which receives EN 105. Conversely, within second portion 102, second temperature-dependent, voltage generating circuit (—PTC$^Y$) 114 receives V3 111, VN_TRIM 112, EN 105, and V4 113. Second temperature-dependent, voltage generating circuit 114 is coupled to second voltage clamp circuit 115 and to an input of buffer 116. An output of buffer 116 is coupled to second analog multiplexer 117, which receives EN 105.

In general terms, +PTC$^X$ 107 is configured to generate a positive voltage magnitude proportional to $T^X$, where T is the absolute temperature of biasing circuit 100 and x is a selected parameter. Similarly, –PTC$^Y$ 114 is configured to generate a negative voltage magnitude proportional to $T^Y$, where y is a selected parameter. Examples of circuits that may be used to implement +PTC$^X$ 107 and –PTC$^Y$ 114 are described in FIGS. 2 and 3, respectively.

In some embodiments, voltage clamp circuits 108 and 115 may be configured to provide over and/or under voltage protection, whereas buffers 109 and 116 may be unity-gain amplifiers or the like. The output of first analog multiplexer 110 may be VP 118 or V2 106, depending upon the level of EN 105. Similarly, the output of second analog multiplexer 117 may be VN 119 or V3 111 depending upon the level of EN 105.

Still referring to FIG. 1, V2 106 and V3 111 represent the upper and lower bounds, respectively, of the normal voltage supply range of a power switch or logic circuit to which biasing circuit 100 is coupled. For example, in an implementation where the power switch or logic circuit is designed to operate with a supply range of 0 V to 1.2 V, V2 106 may have a value of 1.2 V and V3 111 may have a value of 0 V. Meanwhile, VP 118 and VN 119 are voltages above and below the normal supply range. In the preceding example, VP 118 may be approximately (e.g., within 1%, 5%, or 10% of) 1.5 V and VN 119 may be approximately –0.3 V.

In some implementations, V1 103 may be used to properly bias +PTC$^X$ 107, voltage clamp circuit 108, buffer 109, and first analog multiplexer 110. For example, for V2=1.2 V, V1=2.5 V may be used. Conversely, V4 113 may be used to properly bias the −PTCs 114, voltage clamp circuit 115, buffer 116, and second analog multiplexer 117. For instance, for V3=0 V, V4=−1.5 V may be used.

Figure 5:
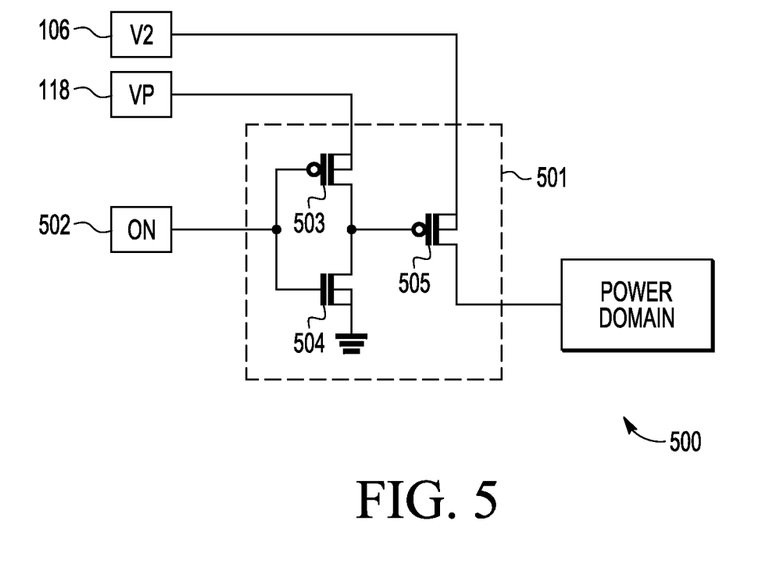
FIG. 5 is a circuit diagram of an example of gate reverse biasing of a power switch application according to some embodiments.
Figure 7:
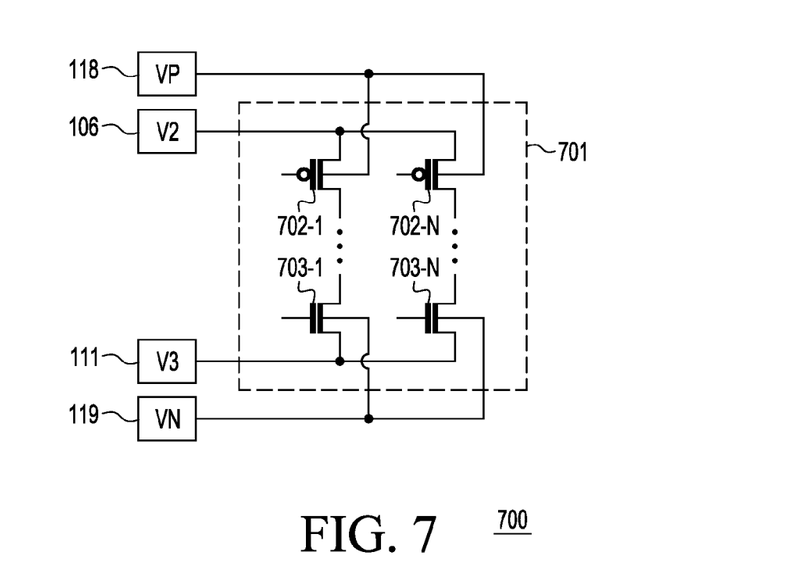
FIG. 7 is a circuit diagram of an example of back biasing of a logic circuit application according to some embodiments.

In some embodiments, VP 118 may be used to reverse bias one or more p-type metal-oxide-semiconductor (PMOS) power switches as a function of temperature, as shown in the example of FIG. 5. Additionally or alternatively, VP 118 may be used to back-bias one or more PMOS transistors in a logic circuit as a function of temperature, as shown in the example of FIG. 7. Conversely, VN 119 may be used to reverse bias one or more n-type metal-oxide-semiconductor (NMOS) power switches and/or to back-bias one or more NMOS transistors in a logic circuit, both also as a function of temperature.

It should be noted that, in some cases, it may be interesting to reverse bias only PMOS or only PMOS power switches, therefore either portion 101 or 102 may be absent from biasing circuit 100. In other implementations, two or more instances of any of portions 101 or 102 may be present in biasing circuit 100.

Figure 2:
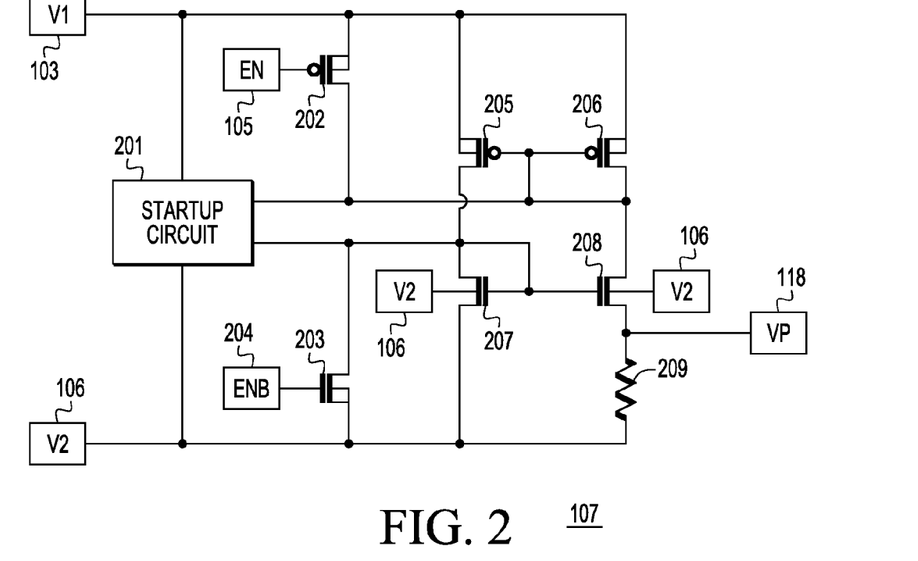
FIG. 2 is a circuit diagram of an example of a first temperature-dependent, voltage generating circuit according to some embodiments.

FIG. 2 is a circuit diagram of an example of first temperature-dependent, voltage generating circuit (+PTC$^X$) 107 according to some embodiments. Particularly, +PTC$^X$ 107 receives V1 103 at startup circuit 201, at the source terminals (also referred to as first current terminals or electrodes) of PMOS transistors 202, 205, and 206. The sources of PMOS transistors 202, 205, and 206 are coupled to their respective bulks. Also, V2 106 is received at startup circuit 201, at the source terminals of NMOS transistors 203, 207, and 208, and at the bulks of transistors 207 and 208.

The gate terminal (also referred to as a control terminal or electrode) of PMOS transistor 202 is coupled to EN 105. The gate terminal of NMOS transistor 203 is coupled to the inverse of EN 105, here depicted as ENB 204.

The drain terminals (also referred to as second current terminals or electrodes) of PMOS transistors 202 and 206, as well as the gates of PMOS transistors 205 and 206, are coupled to the drain of NMOS transistor 208 and to startup circuit 201. The drain terminal of PMOS transistor 205 is coupled to the drain terminal of NMOS transistors 203 and 207, and to the gate terminals of NMOS transistors 207 and 208. Also, resistor 209 is coupled to the source terminal of NMOS transistor 208. VP 118 is obtained at the node between NMOS transistor 208 and resistor 209.

Startup circuit 201 may include any suitable startup circuit configured to prevent transistors 202-208 from operating in situations where no current flows through +PTC$^X$ circuit 107. Transistors 202 and 203 are configured as switches that control the operation of +PTC$^X$ circuit 107 depending upon the values of EN 105 and ENB 204. Moreover, PMOS transistors 205 and 206, and NMOS transistors 207 and 208 form a current mirror with resistive degenerated source (that is, with resistor 209). As such, the source of NMOS transistor 208 provides a current source where the electrical current flowing through resistor 209, and therefore also voltage VP 118 across resistor 209, are directly proportional to the temperature of +PTC$^X$ circuit 107 and/or biasing circuit 100.

Again, VP 118 has a positive voltage magnitude proportional to T$^x$, where T is the temperature. In some cases, the aspect ratios and/or other parameters of NMOS transistors 207 and 208 may be selected to determine factor x (e.g., x=1, 2, etc.). For instance, when NMOS transistors 207 and 208 are operating in weak inversion, the difference between VP 118 and V2 106 (designated as "ΔVx") varies with T as follows:

$$\Delta V_x = n \cdot \left(\frac{kT}{q}\right) \ln\left[\frac{\frac{W_{208}}{L_{208}}}{\frac{W_{207}}{L_{207}}}\right]$$

where n is the subthreshold slope parameter, k is the Boltzmann constant, T is the absolute temperature, q is the electron charge, $W_{208}$ is the width of the channel formed in NMOS transistor 208, $L_{208}$ is the length of the channel formed in NMOS transistor 208, $W_{207}$ is the width of the channel formed in NMOS transistor 207, and $L_{207}$ is the length of the channel formed in NMOS transistor 207.

As another example, if NMOS transistors 207 and 208 are operating in strong inversion, ΔVx varies with T according to:

$$\Delta V_x = \frac{2 \cdot (T/T_r)^{K_3}}{\mu_n(T_r) \cdot C_{ox} \cdot R} \cdot \left[\frac{1}{\sqrt{\frac{W_{207}}{L_{207}}}} - \frac{1}{\sqrt{\frac{W_{208}}{L_{208}}}}\right]^2$$

where T is the absolute temperature, $T_r$ is the absolute reference temperature, $\mu_n(T_r)$ is the surface mobility of the NMOS transistors at reference temperature, $K_3$ is the exponential decrease of mobility with temperature (a value from 1.2 to 2.0), $C_{ox}$ is the capacitance per unit of area of the thin oxide layer, R is the resistance of resistor 209, $W_{208}$ is the width of the channel formed in NMOS transistor 208, $L_{208}$ is the length of the channel formed in NMOS transistor 208, $W_{207}$ is the width of the channel formed in NMOS transistor 207, and $L_{207}$ is the length of the channel formed in NMOS transistor 207.

In some cases, VP_TRIM 104 and VN_TRIM 112 may be digital signals used to adjust VP and VN, respectively. For example, it is possible in some embodiments to change the ratio between NMOS transistors 207 and 208, or the ratio between PMOS transistors 205 and 206, or the value of resistor 209. Also, in some implementations, ΔVx may be amplified to provide wider voltage variations as a function of temperature, for example, by adding a resistor (not shown) between the source of NMOS transistor 203 and the source of NMOS transistor 207. This may be useful, for instance, in situations where the circuit is subject to wider temperature variations (e.g., harsh environments, etc.)

Figure 3:
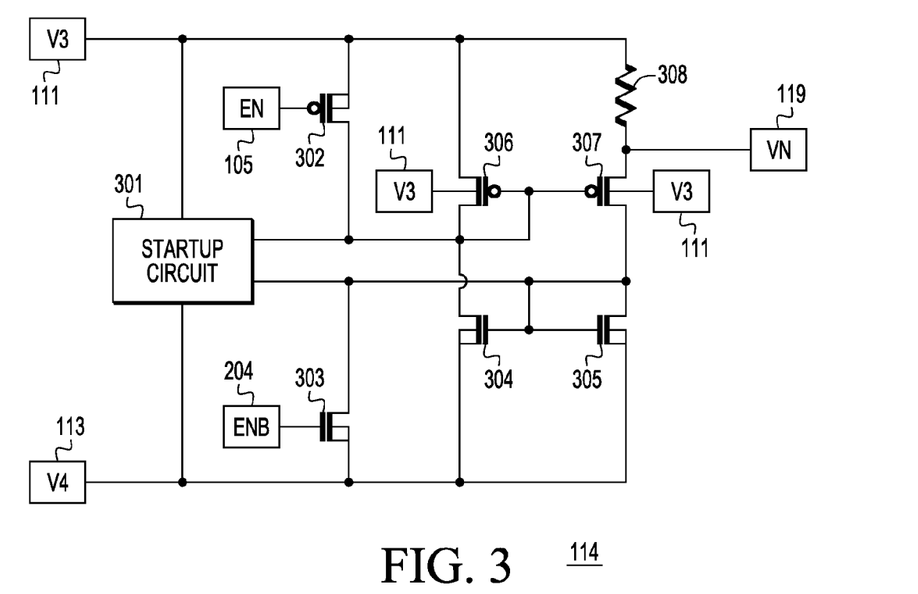
FIG. 3 is a circuit diagram of an example of a second temperature-dependent, voltage generating circuit according to some embodiments.

FIG. 3 is a circuit diagram of an example of second temperature-dependent, voltage generating circuit (−PTC$^Y$) 114 according to some embodiments. Particularly, −PTC$^Y$ 114 receives V3 111 at startup circuit 301, at the source terminals of PMOS transistors 302, 306, and 307 through resistor 308. The source and bulk terminals of PMOS transistors 302 and 306 are connected together to V3 111. PMOS transistor 307 also has its bulk connected to V3 111. Similarly, the respective source and bulk terminals of NMOS transistors 303, 304, and 305 are connected together to V4 114. Also, V4 113 is received at startup circuit 301, whereas V1 103 (shown in FIG. 2) is received at the bulks of PMOS transistors 306 and 307.

The gate terminal (also referred to as a control terminal or electrode) of PMOS transistor 302 is coupled to EN 105. The gate terminal of NMOS transistor 303 is coupled to the inverse of EN 105, or ENB 204.

The drain terminals of PMOS transistors 302 and 306, as well as the gates of PMOS transistors 306 and 307, are coupled to the drain of NMOS transistor 304 and to startup circuit 301. The drain terminal of PMOS transistor 307 is coupled to the drain terminal of NMOS transistors 303 and 305, and to the gate terminals of NMOS transistors 304 and 305. In this case, VN 119 is obtained at the node between PMOS transistor 307 and resistor 308.

Similarly as in FIG. 2, here circuit 301 may include any suitable startup circuit configured to prevent transistors 302-307 from operating in situations where no current flows through $-PTC^Y$ circuit 114. Transistors 302 and 303 are configured as switches that control the operation of $-PTC^Y$ circuit 114 depending upon the values of EN 105 and ENB 204. Moreover, PMOS transistors 306 and 307 are in mirror configuration with source of 307 degenerated by resistance 308; and NMOS transistors 304 and 305 are also in a current mirror configuration. As such, the source of PMOS transistor 307 provides a current source where the electrical current flowing through resistor 308, and therefore also voltage VN 119 across resistor 308, are directly proportional to the temperature of $-PTC^Y$ circuit 114 and/or biasing circuit 100.

In operation, VN 119 has a negative voltage magnitude proportional to $T^X$, where T is the temperature. In some cases, the aspect ratios and/or other parameters of PMOS transistors 306 and 307 may be selected to determine factor y (e.g., y=1, 2, etc.).

Figure 4:
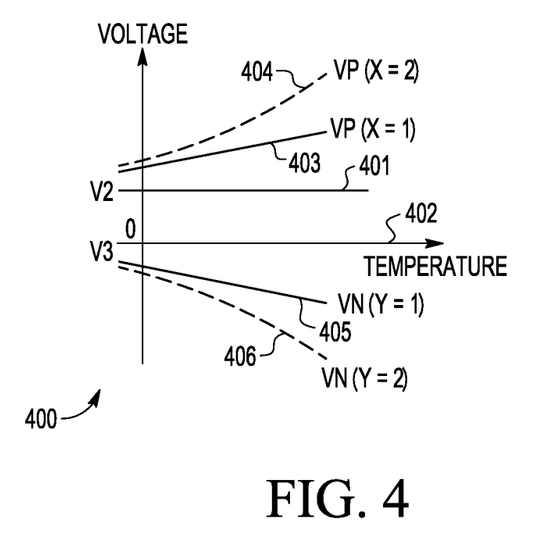
FIG. 4 is a graph illustrating examples of temperature dependent voltages generated by a biasing circuit according to some embodiments.

FIG. 4 is a graph illustrating examples of temperature dependent voltages generated by biasing circuit 100 according to some embodiments. As shown in graph 400, curves 401 and 402 represent voltages V2 106 and V3 111, which do not change with temperature variations. In contrast, curve 403 shows a linear temperature dependence of VP 118 (when x=1), and curve 404 shows a quadratic temperature dependence of VP 118 (when x=2). Conversely, curve 405 shows a linear temperature dependence of VN 119 (when x=1), and curve 406 shows a quadratic temperature dependence of VN 119 (when x=2).

In terms of absolute voltage value, when the temperature of the circuit increases, VP 118 also increases and VN 119 decreases; and when the temperature decreases, VP 118 decreases and VN 119 increases. In terms of voltage magnitude, both VP 118 and VN 119 increase when the temperature increases, and both decrease when the temperature decreases.

To illustrate an example of a gate reverse biasing application of biasing circuit 100, FIG. 5 depicts circuit diagram 500 of a power switch according to some embodiments. Particularly, power switch 501 includes PMOS transistor 503, NMOS transistor 504, and PMOS transistor 505 (the main switching transistor). In operation, power switch receives on/off signal 502 and, based upon that signal, PMOS transistor 505 may allow power domain 506 to receive V2 106. For example, if the voltage range of power domain is 0 to 1.2 V, V2 106 may be 1.2 V.

Because of its physical size, even when power switch 501 is turned off—that is, its source-to-gate voltage ($V_{SG}$) is 0.0 V—subthreshold currents flowing or "leaking" through PMOS transistor 505 are significant. Furthermore, these leakage currents vary with temperature such that they increase with higher temperatures.

Accordingly, to reduce or eliminate these leakage currents, temperature dependent voltage VP 118 may be applied to the gate of PMOS transistor 505 through PMOS transistor 503 when PMOS transistor 503 is turned on; thus causing PMOS transistor 505 to be turned off and reversed biased by a boosted, temperature-dependent voltage. In the previous example, for instance, when the temperature is 150° C., VP 118 may be 1.5V. As the temperature changes, VP 118 also changes. In contrast, without biasing circuit 100, PMOS transistor 505 would be turned off by V2 106 equal to a constant 1.2 V independent of temperature.

Figure 6:
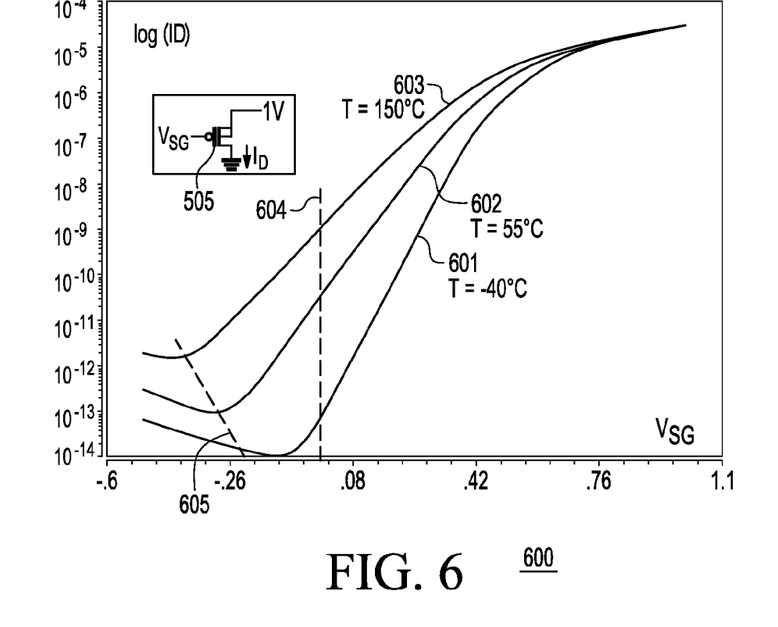
FIG. 6 is a graph illustrating an example of operating points of a power switch as a function of source-to-gate ($V_{SG}$) for three temperatures according to some embodiments.

More generally, it may be noted that biasing circuit 100 may be applied to drive the gates of CMOS transistors beyond the supply voltage range in order to reduce subthreshold currents. In that regard, FIG. 6 shows graph 600 illustrating an example of operating points of a power switch as a function of $V_{SG}$ for three temperatures according to some embodiments. Here, PMOS transistor 505 receives 1 V at its source terminal, and the leakage current flowing between source and drain is shown as $I_D$. PMOS transistor 505 has a channel width of 135 nm and a channel length of 60 nm. Three temperature curves 601 at −40° C., 602 at 55° C., and 603 at 150° C. are shown against $I_D$ and the source-to-gate voltage ($V_{SG}$=V2−VP) of transistor 505.

Line 604 illustrates a biasing situation with a constant voltage of 0 V, and line 605 illustrates a biasing situation with temperature dependent VP 118, according to some embodiments. It may be noted that line 605 is such that, at colder temperatures, VP 118 is relatively small but increases as the temperature increases, thus reducing or minimizing $I_D$ across various different temperatures. For each different curve 601-603 there are different optimal operating points beyond which additional reverse bias actually increases $I_D$; accordingly, to reach each different optimal operating point on line 605, VP 118 also varies with temperature.

To illustrate another context where biasing circuit 100 may be used, FIG. 7 shows circuit diagram 700 as example of back biasing of a logic circuit application according to some embodiments. Particularly, logic circuit 701 includes a plurality of complementary metal-oxide semiconductor (CMOS) devices including PMOS transistors 702-1 through 702-N and NMOS transistors 703-1 through 703-N. The source terminals of PMOS transistors 702-1 through 702-N are coupled to V2 106, and the source terminals of NMOS transistors 703-1 through 703-N are coupled to V3 111. Moreover, the bulks of PMOS transistors 702-1 through 702-N are coupled to VP 118, and the bulks of NMOS transistors 703-1 through 703-N are coupled to VN 119.

In order to reduce the static power consumption of logic circuit 701 in low-power modes, biasing circuit 100 may be used with a body-biasing technique called Variable Threshold CMOS (VTMOS). In high-power modes, zero or nearly-zero body bias voltages are applied. In low-power modes, however, reverse body bias voltages VP 118 and VN 119 are applied to increase the threshold voltage and cut off leakage current.

Figure 8:
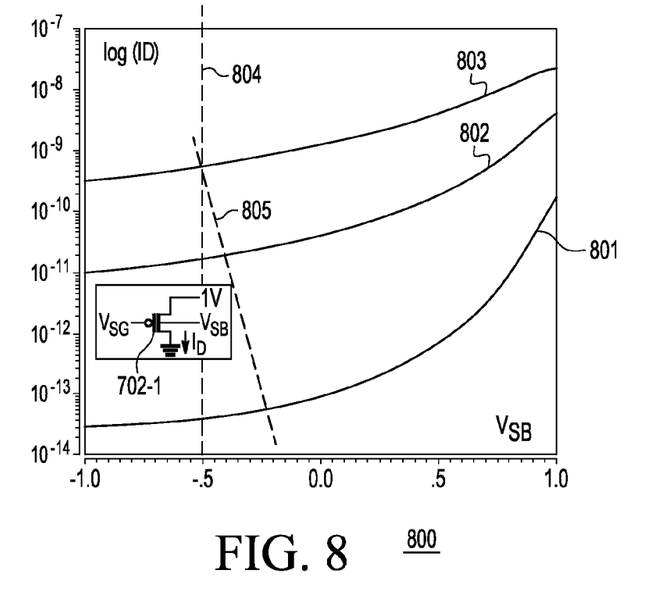
FIG. 8 is a graph illustrating an example of operating points of a logic circuit as a function of source-to-bulk voltages ($V_{SB}$) for three temperatures according to some embodiments.

FIG. 8 is a graph illustrating an example of operating points of a logic circuit as a function of $V_{SB}$ (with $V_{SG}$=0 V) for three temperatures according to some embodiments. PMOS transistor 702-1 receives 1 V at its source terminal, and the leakage current flowing between source and drain is shown as $I_D$. PMOS transistor 702-1 has a channel width of 135 nm and a channel length of 60 nm.

Three temperature curves 801 at −40° C., 802 at 55° C., and 803 at 150° C. are shown against $I_D$ and the $V_{SB}$ of transistor 702-1. Similarly as in FIG. 6, here line 804 is illustrates a biasing situation with a constant voltage of 0 V. As temperatures rise, $V_{SB}$ also increases, and as temperatures drop, $V_{SB}$ decreases, thus following line 805 showing the operating points of PMOS transistor 702-1 with reduced leakage current $I_D$.

Figure 9:
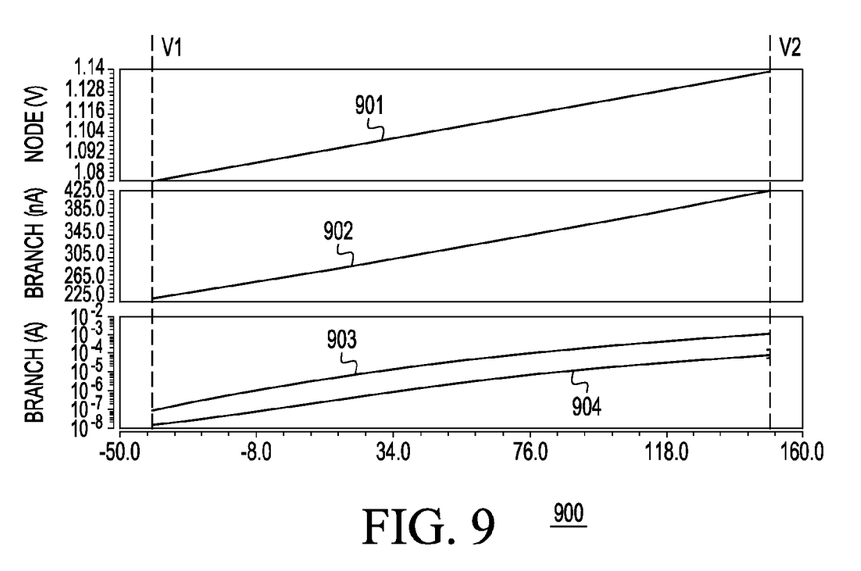
FIG. 9 is a graph illustrating an example of a power switch application according to some embodiments.

FIG. 9 shows graph 900 illustrating an example of a power switch application according to some embodiments. Particularly, curve 901 shows VP 118 increasing linearly between V1 103 and V2 106 as a function of temperature. Curve 902 shows the current consumption of biasing circuit 100 itself under those same conditions. Curve 903 shows the leakage current of a PMOS power switch without using temperature-dependent reverse biasing, and curve 904 shows the leakage current of the same power switch using VP 118 coupled to the transistor's gate. Accordingly, in this example, it is noted that the use of temperature-dependent reverse biasing decreases leakage from approximately 1.243 mA to 86 uA at 150° C., for an approximately 93% reduction at that temperature.

Figure 10:
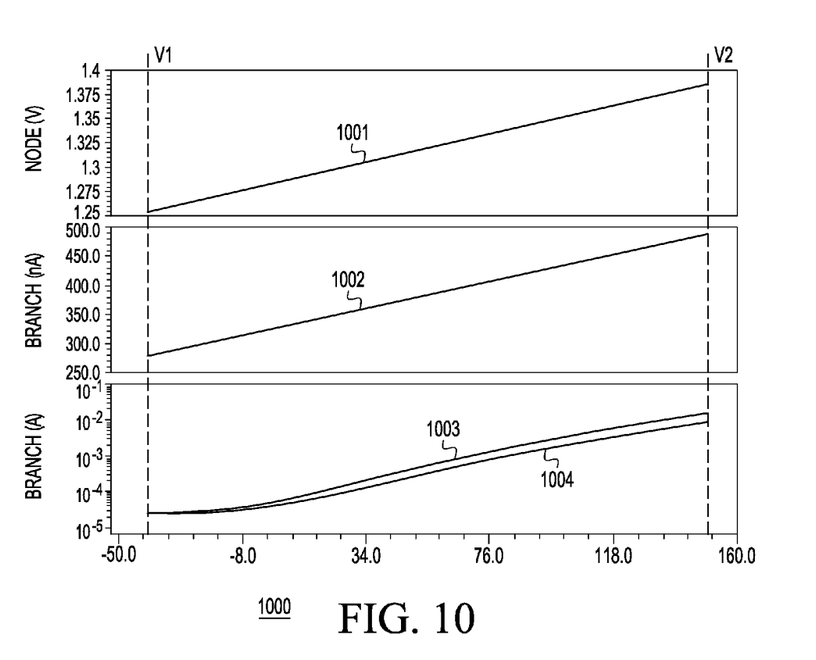
FIG. 10 is a graph illustrating an example of a logic circuit application according to some embodiments.

FIG. 10 shows graph 1000 illustrating an example of a logic circuit application according to some embodiments. Similarly as above, here curve 1001 shows VP 118 increasing linearly as a function of temperature, and curve 1002 shows the current consumption of biasing circuit 100 itself under those same conditions. Curve 1003 shows a leakage current of a PMOS transistor in a logic inverter without using temperature-dependent back biasing, and curve 1004 shows the leakage current of the same PMOS transistor using VP 118 coupled to the transistor's bulk. In this case, the use of temperature-dependent reverse biasing decreases leakage from approximately 14.18 mA to approximately 8.47 mA, for an approximately 40% reduction which becomes larger as temperatures increase further. Moreover, it should be noted that the leakage reduction is cumulative across millions of transistors in a typical logic circuit, and can therefore add up to significant reductions in power consumption.

As described herein, in an illustrative, non-limiting embodiment, a semiconductor device may include a biasing circuit configured to generate a voltage that varies dependent upon a temperature of the semiconductor device and a logic circuit operably coupled to the biasing circuit, where the voltage is applied to a bulk terminal of one or more transistors within the logic circuit, and where the voltage has a value outside of a voltage supply range of the logic circuit.

In some implementations, magnitude of the voltage may increase in response to an increase in the temperature of the semiconductor device, and the magnitude of the voltage may decrease in response to the temperature of the semiconductor device decreasing. Moreover, the voltage may be configured to reduce a leakage current of the one or more transistors.

For example, the voltage may be above the voltage supply range of the logic circuit when the one or more transistors are PMOS transistors. Additionally or alternatively, the voltage may be below the voltage supply range of the logic circuit when the one or more transistors are NMOS transistors.

The biasing circuit may further include a first current mirror including two PMOS transistors, a second current mirror including two NMOS transistors operably coupled to the first current mirror, and a resistor operably coupled to the second current mirror. A current through one of the two NMOS transistors may be proportional to the temperature of the semiconductor device, and a voltage across the resistor may be proportional to the current. Additionally or alternatively, the biasing circuit may further include a first current mirror including two NMOS transistors, a second current mirror including two PMOS transistors operably coupled to the first current mirror, and a resistor operably coupled to the second current mirror. A current through one of the two PMOS transistors may be proportional to the temperature of the semiconductor device, and a voltage across the resistor may be proportional to the current.

In another illustrative, non-limiting embodiment, a semiconductor device may include a biasing circuit configured to generate a voltage that varies according to a temperature of the semiconductor device, and a power switch operably coupled to the biasing circuit, wherein the voltage is applied to a gate terminal of the power switch, and wherein the voltage has a value outside of a voltage supply range of the power switch.

In some implementations, a magnitude of the voltage may increase in response to an increase in the temperature of the semiconductor device, and the magnitude of the voltage may decrease in response to the temperature of the semiconductor device decreasing. The voltage may be configured to reduce a subthreshold current of the power switch while the power switch is turned off.

For example, the voltage may be above the voltage supply range of the power switch when the power switch is PMOS transistor. Additionally or alternatively, the voltage may be below the voltage supply range of the power switch when the power switch is an NMOS transistor.

The biasing circuit may also include a first current mirror including two PMOS transistors, a second current mirror including two NMOS transistors operably coupled to the first current mirror, and a resistor operably coupled to the second current mirror. A current through one of the two NMOS transistors may be proportional to the temperature of the semiconductor device, and a voltage across the resistor may be proportional to the current. Additionally or alternatively, the biasing circuit may include a first current mirror including two NMOS transistors, a second current mirror including two PMOS transistors operably coupled to the first current mirror, and a resistor operably coupled to the second current mirror. A current through one of the two PMOS transistors may be proportional to the temperature of the semiconductor device, and a voltage across the resistor may be proportional to the current.

In some cases, the power switch may be operably coupled to one of a plurality of different power domains within the semiconductor device.

In yet another illustrative, non-limiting embodiment, a method may include generating a voltage that varies as a function of a temperature of a semiconductor device; and performing at least one of: applying the voltage to a control terminal of a power switch within the semiconductor device, where the voltage has a value outside of a voltage supply range of the power switch; or applying the voltage to a bulk terminal of one or more transistors within a logic circuit of the semiconductor device, where the voltage has a value outside of a voltage supply range of the logic circuit.

The voltage may be configured to cause a temperature-dependent reverse biasing of the power switch and/or the voltage may be configured to cause a temperature-dependent back biasing of the one or more transistors. In some cases, the voltage supply range may be 0 V to 1.2 V, and the voltage value may be approximately 0.3 V above or below the voltage supply range. Moreover, the voltage may vary approximately linearly or quadratically with the temperature of the semiconductor device.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 11:
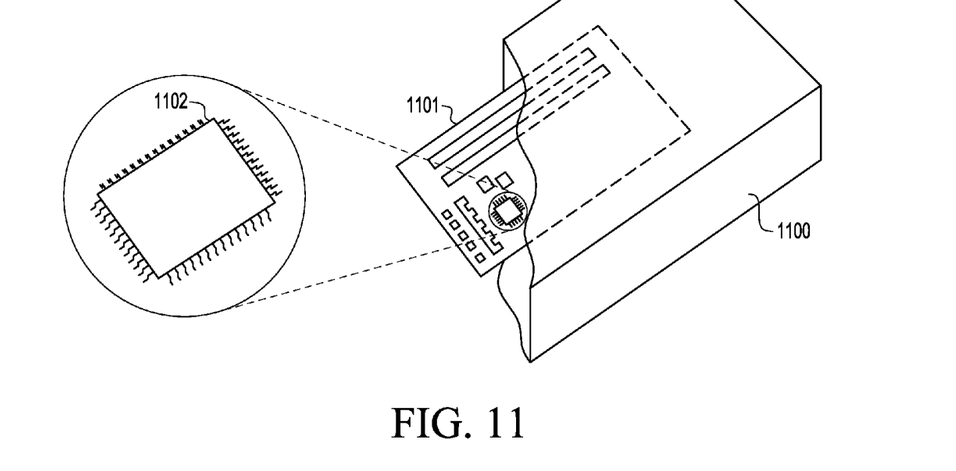
FIG. 11 is a diagram of an example of an electronic device having one or more electronic microelectronic device packages, according to some embodiments.

Turning to FIG. 11, a block diagram of electronic device 1100 is depicted. In some embodiments, electronic device 1100 may be any of the aforementioned electronic devices, or any other electronic device. As illustrated, electronic device 1100 includes one or more Printed Circuit Boards (PCBs) 1101, and at least one of PCBs 1101 includes one or more microelectronic device packages(s) 1102. In some implementations, device package(s) 1102 may include circuitry configured to provide temperature dependent biasing for leakage power reduction, as discussed above.

Examples of device package(s) 1102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 1102 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 1102 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 1102 may include one or more Micro-ElectroMechanical Systems (MEMS), Nano-Electro-Mechanical Systems (NEMS), or the like.

Generally speaking, device package(s) 1102 may be configured to be mounted onto PCB 1101 using any suitable packaging technology such as, for example, Ball Grid Array (BGA) packaging or the like. In some applications, PCB 1101 may be mechanically mounted within or fastened onto electronic device 1100. It should be noted that, in certain implementations, PCB 1101 may take a variety of forms and/or may include a plurality of other elements or components in addition to device package(s) 1102. It should also be noted that, in some embodiments, PCB 1101 may not be used and/or device package(s) 1102 may assume any other suitable form(s).

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A semiconductor device, comprising:
 a biasing circuit configured to generate a voltage that varies dependent upon a temperature of the semiconductor device, wherein a magnitude of the voltage increases in response to an increase in the temperature of the semiconductor device, and wherein the magnitude of the voltage decreases in response to the temperature of the semiconductor device decreasing; and
 a logic circuit operably coupled to the biasing circuit, wherein the voltage is applied to a bulk terminal of one or more transistors within the logic circuit, and wherein the voltage has a value outside of a voltage supply range of the logic circuit, wherein the biasing circuit further comprises: a first current mirror including two PMOS transistors, a second current mirror including two NMOS transistors operably coupled to the first current mirror, and a resistor operably coupled to the second current mirror, wherein a current through one of the two NMOS transistors is proportional to the temperature of the semiconductor device, and wherein the voltage is provided to the bulk terminal by a node between a source terminal of the one of the two NMOS transistors and the resistor.

2. The semiconductor device of claim 1, wherein the voltage is configured to reduce a leakage current of the one or more transistors.

3. The semiconductor device of claim 1, wherein the voltage is above the voltage supply range of the logic circuit, and wherein the one or more transistors are p-type metal-oxide-semiconductor (PMOS) transistors.

4. The semiconductor device of claim 1, wherein the voltage is below the voltage supply range of the logic circuit, and wherein the one or more transistors are n-type metal-oxide-semiconductor (NMOS) transistors.

5. A method, comprising:
 generating, via a biasing circuit, a voltage that varies as a function of a temperature of a semiconductor device, wherein a magnitude of the voltage increases in response to an increase in the temperature of the semiconductor device, and wherein the magnitude of the voltage decreases in response to the temperature of the semiconductor device decreasing; and
 applying the voltage to a bulk terminal of one or more transistors within a logic circuit of the semiconductor device, wherein the voltage has a value outside of a voltage supply range of the logic circuit, wherein:
 (a) the biasing circuit comprises: a first current mirror including two PMOS transistors, a second current mirror including two NMOS transistors operably coupled to the first current mirror, and a resistor operably coupled to the second current mirror, wherein a current through one of the two NMOS transistors is proportional to the temperature of the semiconductor device, and wherein the voltage is provided to the bulk terminal by a node between a source terminal of the one of the two NMOS transistors and the resistor; or
 (b) the biasing circuit comprises: a first current mirror including two NMOS transistors, a second current mirror including two PMOS transistors operably coupled to the first current mirror, and a resistor operably coupled to the second current mirror, wherein a current through one of the two PMOS transistors is proportional to the temperature of the semiconductor device, and wherein the voltage is provided to the bulk terminal by a node between a source terminal of the one of the two PMOS transistors and the resistor.

6. The method of claim 5, wherein the voltage is configured to cause a temperature-dependent back biasing of the one or more transistors.

7. The method of claim 5, wherein the voltage supply range is 0 V to 1.2 V, and wherein the voltage value is approximately 0.3 V above or below the voltage supply range.

8. The method of claim 5, wherein the voltage varies approximately linearly with the temperature of the semiconductor device.

9. The method of claim 5, wherein the voltage varies approximately quadratically with the temperature of the semiconductor device.

10. A semiconductor device, comprising:
a biasing circuit configured to generate a voltage that varies dependent upon a temperature of the semiconductor device, wherein a magnitude of the voltage increases in response to an increase in the temperature of the semiconductor device, and wherein the magnitude of the voltage decreases in response to the temperature of the semiconductor device decreasing; and
a logic circuit operably coupled to the biasing circuit, wherein the voltage is applied to a bulk terminal of one or more transistors within the logic circuit, and wherein the voltage has a value outside of a voltage supply range of the logic circuit, wherein the biasing circuit further comprises: a first current mirror including two NMOS transistors, a second current mirror including two PMOS transistors operably coupled to the first current mirror, and a resistor operably coupled to the second current mirror, wherein a current through one of the two PMOS transistors is proportional to the temperature of the semiconductor device, and wherein the voltage is provided to the bulk terminal by a node between a source terminal of the one of the two PMOS transistors and the resistor.

11. The semiconductor device of claim 10, wherein the voltage is configured to reduce a leakage current of the one or more transistors.

12. The semiconductor device of claim 10, wherein the voltage varies approximately linearly with the temperature of the semiconductor device.

13. The semiconductor device of claim 10, wherein the voltage varies approximately quadratically with the temperature of the semiconductor device.

* * * * *